(12) United States Patent
Shigematsu et al.

(10) Patent No.: US 7,265,033 B2
(45) Date of Patent: Sep. 4, 2007

(54) LASER BEAM PROCESSING METHOD FOR A SEMICONDUCTOR WAFER

(75) Inventors: Koichi Shigematsu, Tokyo (JP); Naoki Ohmiya, Tokyo (JP); Toshiyuki Yoshikawa, Tokyo (JP)

(73) Assignee: Disco Corporation, Tokyo (JP)

( * ) Notice: Subject to any disclaimer, the term of this patent is extended or adjusted under 35 U.S.C. 154(b) by 188 days.

(21) Appl. No.: 10/876,519

(22) Filed: Jun. 28, 2004

(65) Prior Publication Data

US 2005/0009307 A1    Jan. 13, 2005

(30) Foreign Application Priority Data

Jul. 2, 2003    (JP)    ............... 2003-190103

(51) Int. Cl.
H01L 21/268 (2006.01)
B23K 26/40 (2006.01)
B23K 26/03 (2006.01)

(52) U.S. Cl. ............. 438/463; 219/121.69; 219/121.83

(58) Field of Classification Search ................ 438/463; 219/121.68, 121.69, 121.83
See application file for complete search history.

(56) References Cited

U.S. PATENT DOCUMENTS

| | | | | |
|---|---|---|---|---|
| 4,328,553 A * | 5/1982 | Fredriksen et al. | .... | 356/139.04 |
| 4,555,610 A * | 11/1985 | Polad et al. | ............ | 219/121.68 |
| 4,970,600 A * | 11/1990 | Garnier et al. | ......... | 219/121.68 |
| 5,278,385 A | 1/1994 | Gerome et al. | | |
| 5,698,120 A * | 12/1997 | Kurosawa et al. | ..... | 219/121.62 |
| 5,961,857 A * | 10/1999 | Takahashi et al. | ..... | 219/121.62 |
| 6,172,325 B1 * | 1/2001 | Baird et al. | ............ | 219/121.62 |
| 6,806,544 B2 * | 10/2004 | Liu | ............................ | 257/414 |
| 2001/0030176 A1 * | 10/2001 | Sun et al. | ................. | 219/121.7 |
| 2002/0190037 A1 | 12/2002 | Steur et al. | | |
| 2002/0192928 A1 * | 12/2002 | Kosugi | ........................ | 438/462 |
| 2003/0006221 A1 * | 1/2003 | Hong et al. | ............ | 219/121.72 |
| 2003/0136769 A1 * | 7/2003 | Lin et al. | ................ | 219/121.69 |
| 2004/0164061 A1 | 8/2004 | Takeuchi et al. | | |

FOREIGN PATENT DOCUMENTS

| | | | |
|---|---|---|---|
| EP | 544398 A1 * | 6/1993 | |
| JP | 2-307206 A * | 12/1990 | |
| JP | 10-173062 | 6/1998 | |
| JP | 2003-068678 | 3/2003 | |
| JP | 2003-320466 | 11/2003 | |
| JP | 2005-118832 | 5/2005 | |

OTHER PUBLICATIONS

Australian Patent Office Search Report issued in connection with SG 2004003799-0, dated Mar. 1997 (Form APO/SG/210).
Intellectual Property Office of Singapore Written Opinion issued in connection with SG 2004003799-0, dated Feb. 2000(Form APO/SG/408).

* cited by examiner

*Primary Examiner*—Geoffrey S. Evans
(74) *Attorney, Agent, or Firm*—Smith, Gambrell & Russell, LLP

(57) ABSTRACT

A laser beam processing method for a semiconductor wafer having a low-dielectric insulating film formed on the front surface of a semiconductor substrate thereof, a plurality of circuits sectioned by streets into a lattice pattern, and metal patterns for testing formed partially on each street. The method includes a laser beam processing step for applying a laser beam to the positions of areas at which the metal patterns are located, and to the low-dielectric insulating film, under different processing conditions so as to remove the metal patterns and the low-dielectric insulating film without damaging the substrate and its circuits.

2 Claims, 5 Drawing Sheets

(a)

(b)

(a)

(b)

(a)

(b)

LASER BEAM PROCESSING METHOD FOR A SEMICONDUCTOR WAFER

FIELD OF THE INVENTION

The present invention relates to a laser beam processing method for a semiconductor wafer which has a low-dielectric insulating film formed on the front surface, a plurality of circuits formed by streets formed in a lattice pattern and metal patterns for testing partially formed on each street, and to a laser beam processing machine.

DESCRIPTION OF THE PRIOR ART

As is known to people of ordinary skill in the art, in the production process of a semiconductor device, a semiconductor wafer having a plurality of areas sectioned by streets (cutting lines) formed in a lattice pattern on the front surface of a substantially disk-like semiconductor substrate and circuits such as IC's or LSI's formed in the sectioned areas is cut along the streets to be divided into individual semiconductor chips. Cutting along the streets of the semiconductor wafer is generally carried out by a cutting machine called "dicer". This cutting machine comprises a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle that is rotated at a high speed and a cutting blade mounted on the spindle. The cutting blade comprises a disk-like base and an annular edge which is mounted onto the side wall of the base and formed as thick as about 20 μm by fixing diamond abrasive grains having a diameter of about 3 μm to the base by electroforming.

In recent years, to improve the throughput of a circuit such as IC or LSI, there has been put to practical use a semiconductor wafer in which a low-dielectric insulating film (Low-k film) composed of a film of an inorganic material such as SiOF or BSF (SiOB) or a film of an organic material such as a polyimide-based or parylene-based polymer has been laminated on the front surface of a semiconductor substrate such as a silicon wafer. As the Low-k film is a laminate consisting of multiple layers (5 to 15 layers) like mica and extremely fragile, when the semiconductor wafer is cut along a street with the cutting blade, the Low-k film is peeled off, and this peeling reaches a circuit and gives a fatal blow to a semiconductor chip.

To solve the above problem, JP-A 2003-320466 discloses a processing machine for applying a laser beam to the Low-k film formed on the streets to remove the film and cutting the semiconductor wafer along the streets from which the Low-k film has been removed, with the cutting blade.

However, in a semiconductor wafer having metal patterns for testing called "test element group (Teg)" for testing the function of each circuit partially formed on the Low-k film on the streets, it involves a problem that even when a laser beam is applied to remove the Low-k film, the metal patterns made of copper or aluminum interfere the laser beam, thereby making it impossible to remove the Low-k film smoothly. As a countermeasure, when a laser beam is applied to the streets upon increasing the output of the laser beam to such an extent that the metal patterns can be removed, a new problem arises that the semiconductor substrate of a street portion where only the Low-k film is formed is broken and debris is scattered and adhered to a bonding pad connected to the circuit, thereby deteriorating the semiconductor chips.

SUMMARY OF THE INVENTION

It is an object of the present invention to provide a laser beam processing method and a laser beam processing machine which are capable of smoothly removing a Low-k film formed on streets formed on a semiconductor substrate and metal patterns for testing partially formed on each street.

To attain the above object, according to the present invention, there is provided a laser beam processing method for a semiconductor wafer having a low-dielectric insulating film formed on the front surface of a semiconductor substrate, a plurality of circuits sectioned by streets formed in a lattice pattern, and metal patterns for testing partially formed on each street, comprising:

a laser beam processing step for applying a laser beam to the positions of the areas at which the metal patterns are located and the area of the low-dielectric insulating film under different processing conditions to remove the metal patterns and the low-dielectric insulating film.

Further, in the present invention, there is provided a laser beam processing method for a semiconductor wafer having a low-dielectric insulating film formed on the front surface of a semiconductor substrate, a plurality of circuits sectioned by streets formed in a lattice pattern, and metal patterns for testing partially formed on each street, comprising:

a street detecting step for detecting the positions of the areas at which the metal patterns are located by taking an image of each street; and a laser beam processing step for applying a laser beam to the positions of the areas at which the metal patterns are located, detected in the street detection step and the area of the low-dielectric insulating film under different processing conditions to remove the metal patterns and the low-dielectric insulating film.

The laser beam processing step comprises a metal pattern removing step for applying a laser beam to the metal patterns to remove the metal patterns and a low-dielectric insulating film removing step for applying a laser beam to the area of the low-dielectric insulating film to remove the low-dielectric insulating film.

Further, to solve the above main technical problem, according to the present invention, there is provided a laser beam processing machine comprising a chuck table for holding a workpiece, a laser beam application means for applying a laser beam to the workpiece held on the chuck table, and an alignment means for detecting an area to be processed by the laser beam application means, wherein the machine further comprises a detection means for detecting the position of the area at which a specific member is located, disposed in the processing area of the workpiece held on the chuck table, a storage means for storing information on the position of the area at which the specific member is located, detected by the detection means, and a control means for controlling the laser beam processing conditions of the laser beam application means based on information stored in the storage means.

The workpiece is a semiconductor wafer having a low-dielectric insulating film on the front surface of a semiconductor substrate and a plurality of circuits sectioned by streets formed in a lattice pattern, the specific member is a metal pattern for testing partially formed on each street, and the detection means comprises a color identification sensor for identifying the color of the low-dielectric insulating film and the color of the metal pattern.

Further, in the present invention, there is provided a laser beam processing machine comprising a chuck table for holding a workpiece, a laser beam application means for applying a laser beam to the workpiece held on the chuck table, and an alignment means for detecting an area to be processed by the laser beam application means, wherein the machine further has a storage means for storing information on the position of the area at which the specific member is located, disposed in the processing area of the workpiece in advance, and a control means for controlling the laser beam processing conditions of the laser beam application means based on information stored in the storage means.

The workpiece is a semiconductor wafer having a low-dielectric insulating film on the front surface of a semiconductor substrate and a plurality of circuits sectioned by streets formed in a lattice pattern, the specific member is a metal pattern for testing partially formed on each street, and the storage means stores information on the position of the area at which the metal pattern is located, in advance.

DETAILED DESCRIPTION OF THE PREFERRED EMBODIMENTS

The laser beam processing method and laser beam processing machine according to the present invention will be described in detail hereinunder with reference to the accompanying drawings.

Figure 1:
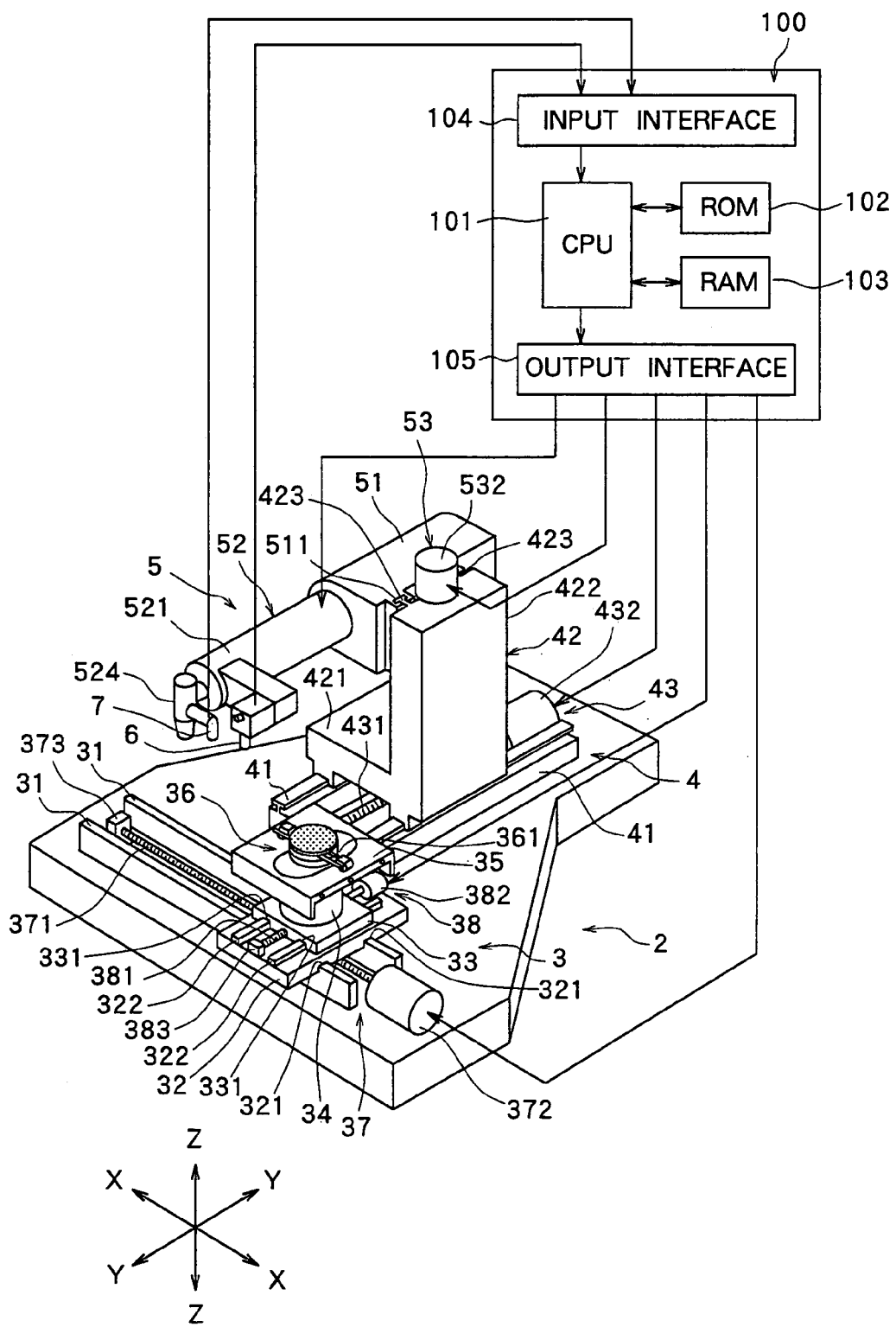
FIG. 1 is a perspective view of a laser beam processing machine constituted according to the present invention.

FIG. 1 is a perspective view of a laser beam processing machine constituted according to the present invention. The laser beam processing machine 1 shown in FIG. 1 comprises a stationary base 2, a chuck table mechanism 3 that is disposed on the stationary base 2 in such a manner that it can move in a direction indicated by an arrow X and holds a workpiece, a laser beam application unit support mechanism 4 disposed on the stationary base 2 in such a manner that it can move in a direction indicated by an arrow Y perpendicular to the direction indicated by the arrow X, and a laser beam application unit 5 disposed on the laser beam application unit support mechanism 4 in such a manner that it can move in a direction indicated by an arrow Z.

The above chuck table mechanism 3 comprises a pair of guide rails 31 and 31 disposed on the stationary base 2 and arranged parallel to each other along the direction indicated by the arrow X, a first slide block 32 disposed on the guide rails 31 and 31 in such a manner that it can move in the direction indicated by the arrow X, a second slide block 33 disposed on the first slide block 32 in such a manner that it can move in the direction indicated by the arrow Y, a support table 35 supported on the second slide block 33 by a cylindrical member 34, and a chuck table 36 as a workpiece holding means. This chuck table 36 comprises an adsorption chuck 361 made of a porous material, and is so constituted as to hold, for example, a disk-like semiconductor wafer as a workpiece on the adsorption chuck 361 by a suction means that is not shown. The chuck table 36 is rotated by a pulse motor (not shown) installed within the cylindrical member 34.

The above first slide block 32 has, on its undersurface, a pair of to-be-guided grooves 321 and 321 to be fitted to the above pair of guide rails 31 and 31 and has, on its top surface, a pair of guide rails 322 and 322 formed parallel to each other along the direction indicated by the arrow Y. The first slide block 32 constituted as described above is constituted to be movable in the direction indicated by the arrow X along the pair of guide rails 31 and 31 by fitting the to-be-guided grooves 321 and 321 onto the pair of guide rails 31 and 31, respectively. The chuck table mechanism 3 in the illustrated embodiment has a moving means 37 for moving the first slide block 32 along the pair of guide rails 31 and 31 in the direction indicated by the arrow X. The moving means 37 comprises a male screw rod 371 arranged between the above pair of guide rails 31 and 31 and in parallel thereto, and a drive source such as a pulse motor 372 for rotary-driving the male screw rod 371. The male screw rod 371 is, at its one end, rotatably supported by a bearing block 373 fixed on the above stationary base 2 and is, at the other end, transmission-coupled to an output shaft of the above pulse motor 372 by a speed reducer that is not shown. The male screw rod 371 is screwed into a threaded through-hole formed in a female screw block (not shown) projecting from the undersurface of the center portion of the first slide block 32. Therefore, by driving the male screw rod 371 in a normal direction or reverse direction by the pulse motor 372, the first slide block 32 is moved along the guide rails 31 and 31 in the direction indicated by the arrow X.

The above second slide block 33 has, on the undersurface, a pair of to-be-guided grooves 331 and 331 to be fitted to the pair of guide rails 322 and 322 on the top surface of the above first slide block 32, and is constituted to be movable in the direction indicated by the arrow Y by fitting the to-be-guided grooves 331 and 331 onto the pair of guide rails 322 and 322, respectively. The chuck table mechanism 3 in the illustrated embodiment has a moving means 38 for moving the second slide block 33 in the direction indicated by the arrow Y along the pair of guide rails 322 and 322 provided on the first slide block 32. The moving means 38 comprises a male screw rod 381 arranged between the above pair of guide rails 322 and 322 and in parallel thereto, and a drive source such as a pulse motor 382 for rotary-driving the male screw rod 381. The male screw rod 381 is, at its one end, rotatably supported on a bearing block 383 fixed on the top surface of the above first slide block 32 and is, at the other end, transmission-coupled to an output shaft of the above pulse motor 382 by a speed reducer that is not shown. The male screw rod 381 is screwed into a threaded through-hole formed in a female screw block (not shown) projecting from the undersurface of the center portion of the second slide block 33. Therefore, by driving the male screw rod 381 in a normal direction or reverse direction by the pulse motor 382, the second slide block 33 is moved along the guide rails 322 and 322 in the direction indicated by the arrow Y.

The above laser beam application unit support mechanism 4 has a pair of guide rails 41 and 41 arranged parallel to each other on the stationary base 2 along the index-feeding direction indicated by the arrow Y, and a movable support base 42 disposed on the guide rails 41 and 41 in such a manner that it can move in the direction indicated by the arrow Y. This movable support base 42 comprises a movable support portion 421 movably mounted on the guide rails 41 and 41, and a mounting portion 422 attached on the movable support portion 421. The mounting portion 422 is provided, at its side surface, with a pair of guide rails 423 and 423 extending in parallel in the direction indicated by the arrow Z. The laser beam application unit support mechanism 4 in the illustrated embodiment has a moving means 43 for moving the movable support base 42 along the pair of guide rails 41 and 41 in the index-feeding direction indicated by the arrow Y. This moving means 43 comprises a male screw rod 431 arranged between the above pair of guide rails 41 and 41 and in parallel thereto, and a drive source such as a pulse motor 432 for rotary-driving the male screw rod 431. The male screw rod 431 is, at its one end, rotatably supported onto a bearing block (not shown) fixed on the above stationary base 2 and is, at the other end, transmission-coupled to the output shaft of the above pulse motor 432 via a speed reducer that is not shown. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction by the pulse motor 432, the movable support base 42 is moved along the guide rails 41 and 41 in the index-feeding direction indicated by the arrow Y.

The laser beam application unit 5 in the illustrated embodiment comprises a unit holder 51 and a laser beam application means 52 attach to the unit holder 51. The unit holder 51 has a pair of to-be-guided grooves 511 and 511 to be slidably fitted onto the pair of guide rails 423 and 423 on the above mounting portion 422, and is supported in such a manner that it can move in the direction indicated by the arrow Z by fitting the to-be-guided grooves 511 and 511 to the above guide rails 423 and 423, respectively.

Figure 2:
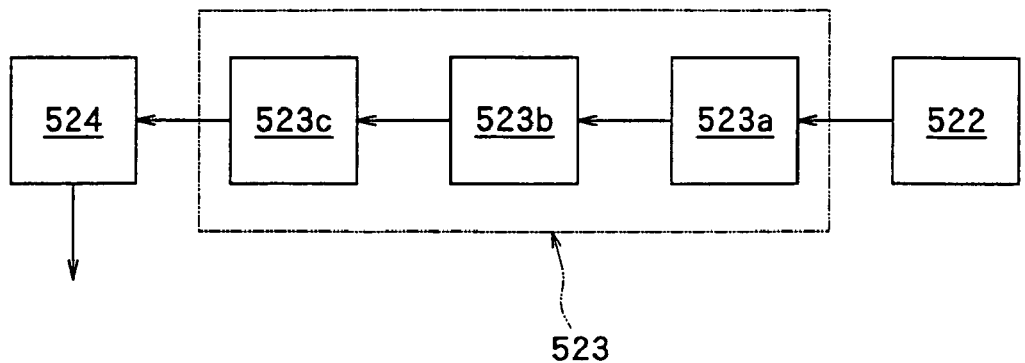
FIG. 2 is a block diagram schematically showing the constitution of the laser beam application means equipped in the laser beam processing machine shown in FIG. 1.

The illustrated laser beam application means 52 comprises a cylindrical casing 521 secured to the above unit holder 51 and extending substantially horizontally. In the casing 521, there are installed a laser beam oscillation means 522 and a laser beam modulation means 523 as shown in FIG. 2. A YAG laser oscillator or a YVO4 laser oscillator may be used as the laser beam oscillation means 522. The laser beam modulation means 523 comprises a repetition frequency setting means 523a, a laser beam pulse width setting means 523b and a laser beam wavelength setting means 523c. The repetition frequency setting means 523a, laser beam pulse width setting means 523b and laser beam wavelength setting means 523c constituting the laser beam modulation means 523 may be of types well known among people of ordinary skill in the art and therefore, detailed descriptions of their structures are omitted in this text. A condenser 524 that may be of types known per se, is attached to the end of the above casing 521.

A laser beam oscillated from the above laser beam oscillation means 522 reaches the condenser 524 through the laser beam modulation means 523. In the laser beam modulation means 523, the repetition frequency setting means 523a converts the laser beam into a pulse laser beam having a predetermined repetition frequency, the laser beam pulse width setting means 523b sets the pulse width of the pulse laser beam to a predetermined width, and the laser beam wavelength setting means 523c sets the wavelength of the pulse laser beam to a predetermined value.

With reference to FIG. 1, an alignment means 6 for detecting the processing area to be processed by the above laser beam application means 52 is installed at the front end of the casing 521 constituting the above laser beam application means 52. This alignment means 6 in the illustrated embodiment comprises an illumination means for illuminating the workpiece, an optical system for capturing an area illuminated by the illumination means and an image pick-up device (CCD) for taking an image captured by the optical system, and transmits an image signal to a control means which will be described later.

The laser beam processing machine in the illustrated embodiment comprises a detection means 7 for detecting the position of the area at which a metal pattern (specific member) is located by taking an image of a street (processing area) of the workpiece which will be described later. In this embodiment, this detection means 7 is mounted on the condenser 524 constituting the laser beam application means 52, and is constituted by an illumination means for illuminating the workpiece, an optical system for capturing an area illuminated by the illumination means and a color identification sensor for identifying the color of an image captured by the optical system, and transmits a detection signal to the control means which will be described later.

The laser beam application unit 5 in the illustrated embodiment has a moving means 53 for moving the unit holder 51 along the pair of guide rails 423 and 423 in the direction indicated by the arrow Z. Like the aforementioned moving means, the moving means 53 comprises a male screw rod (not shown) arranged between the pair of guide rails 423 and 423, and a drive source such as a pulse motor 532 for rotary-driving the male screw rod. By driving the male screw rod (not shown) in a normal direction or reverse direction by the pulse motor 532, the unit holder 51 and the laser beam application means 52 are moved along the guide rails 423 and 423 in the direction indicated by the arrow Z.

The laser beam processing machine in the illustrated embodiment comprises a control means 100. The control means 100 is composed of a microcomputer, and comprises a central processing unit (CPU) 101 which processes operations according to a control program, a read-only memory (ROM) 102 for storing the control program, a random access memory (RAM) 103 which stores the results of operations and enables information to be read therefrom and written thereto, an input interface 104 and an output interface 105. The random access memory (RAM) 103 functions as a storage means for storing information on the position of the area at which the metal pattern is located, detected by the above detection means 7. Detection signals from the alignment means 6 and the detection means 7 are input to the input interface 104 of the control means 100 thus constituted. Control signals are output to the above pulse motor 372, pulse motor 382, pulse motor 432, pulse motor 532 and laser beam application means 52 from the output interface 105.

A description is subsequently given of the laser beam processing method for processing a semiconductor wafer as the workpiece by using the above-described laser beam processing machine.

Figure 3:
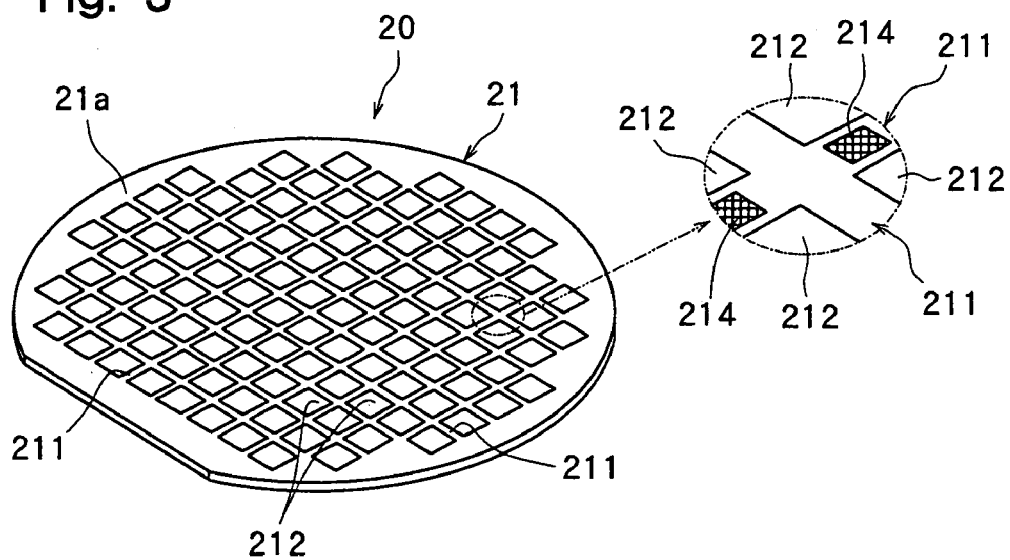
FIG. 3 is a perspective view of a semiconductor wafer as a workpiece to be processed by the laser beam processing method of the present invention.
Figure 4:
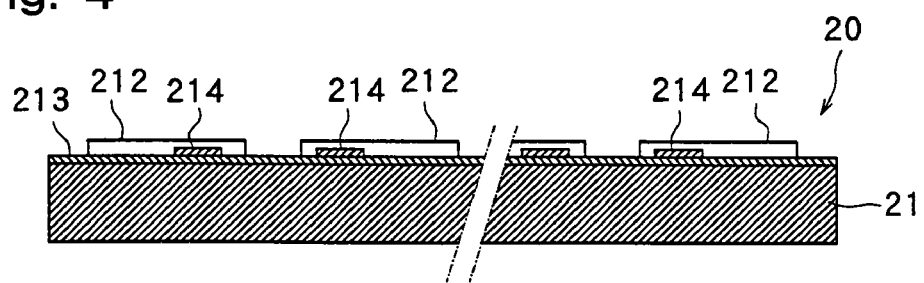
FIG. 4 is an enlarged sectional view of the semiconductor wafer shown in FIG. 3.

FIG. 3 is a perspective view of a semiconductor wafer to be processed by the laser beam processing method of the present invention, and FIG. 4 is an enlarged sectional view of streets 211 formed on the semiconductor wafer shown in FIG. 3. In the semiconductor wafer 20 shown in FIG. 3 and FIG. 4, a plurality of areas are sectioned by a plurality of streets (cutting lines) 211 formed in a lattice pattern on the front surface 21a of a semiconductor substrate 21 such as a silicon wafer, and a circuit 212 such as IC or LSI is formed in each of the sectioned areas. In this semiconductor wafer 20, a low-dielectric insulating film 213 is laminated on the front surface of the semiconductor substrate 21, and a plurality of metal patterns for testing 214 called "test element group (Teg)" for testing the function of the circuit 212 are partially formed on each street 211.

The semiconductor wafer 20 constituted as described above is placed on the adsorption chuck 361 of the chuck table 36 constituting the chuck table mechanism 3 of the laser beam processing machine 1 shown in FIG. 1 in such a manner that its front side 21a faces up, and suction-held on the adsorption chuck 361. The chuck table 36 suction-holding the semiconductor wafer 20 is moved along the guide rails 31 and 31 by the moving means 37 to be positioned right below the alignment means 6 disposed on the laser beam application unit 5.

After the chuck table 36 is positioned right below the alignment means 6, an alignment work for detecting the processing area to be processed, of the semiconductor wafer 20 is carried out by the alignment means 6 and the control means 100. That is, the alignment means 6 and the control means 100 carry out image processing such as pattern matching to align a street 211 formed on the semiconductor wafer 20 in a predetermined direction with the condenser 524 of the laser beam application unit 5 for applying a laser beam along the street 211, thereby performing the alignment of a laser beam application position. Similarly, the alignment of the laser beam application position is carried out also for streets 211 extending in a direction perpendicular to the above predetermined direction and formed on the semiconductor wafer 20.

Figure 5:
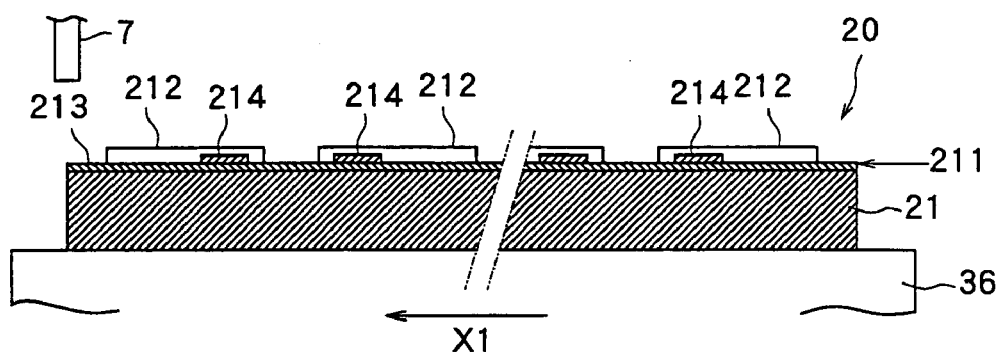
FIGS. 5(a) and 5(b) are diagrams for explaining the street detecting step in the laser beam processing method of the present invention.
Figure 5:
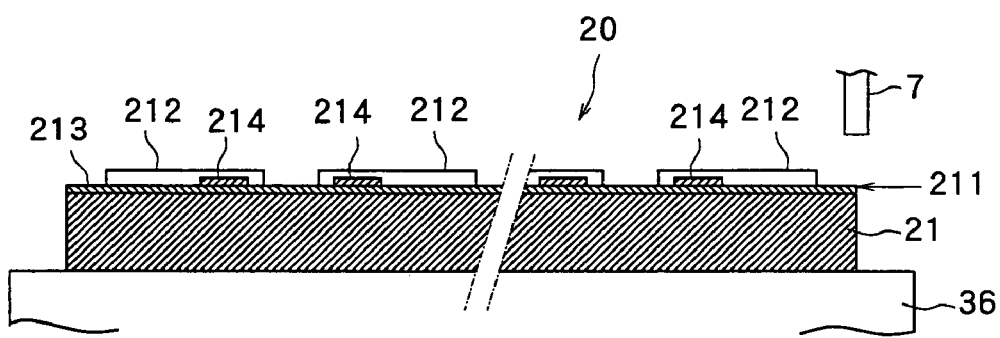

After the street 211 formed on the semiconductor wafer 20 held on the chuck table 36 is detected and the alignment of the laser beam application position is carried out as described above, the chuck table 36 is moved to bring one end (left end in the figure) of a predetermined street 211 to a position right below the detection means 7 as shown in FIG. 5(a). Then, the position of the area at which each metal pattern 214 as the specific member is located, formed on the street 211, that is, the coordinate values in the X direction of one end to the other end in the X direction of each metal pattern 214 are detected by the detection means 7 in the course of movement of the chuck table 36 in a direction indicated by an arrow X1 until the detection means 7 reaches the other end (right end in the figure) of the predetermined street 211 as shown in FIG. 5(b), and the detected coordinate values are sent to the control means 100 (street detection step) The control means 100 temporarily stores the input X-direction coordinate values of each metal pattern 214 formed on the street 211 in the random access memory (RAM) 103.

Figure 6:
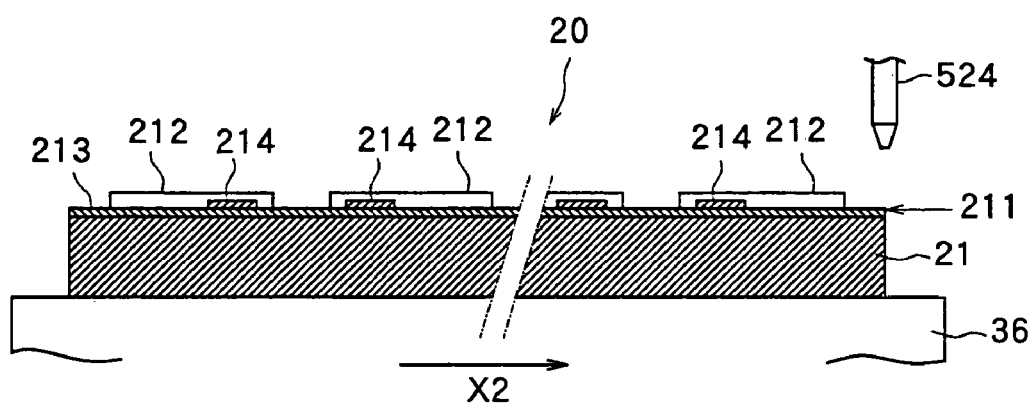
FIGS. 6(a) and 6(b) are diagrams for explaining the metal pattern removing step in the laser beam processing method of the present invention.
Figure 6:
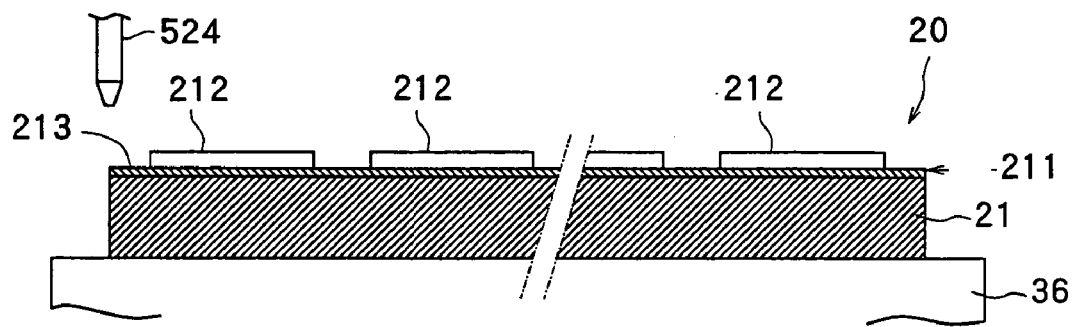

Thereafter, the chuck table 36 is moved to bring the other end (right end in the figure) of the predetermined street 211 having the metal patterns 214 whose X-direction coordinate values have been detected, to a position right below the condenser 524 of the laser beam application means 52, as shown in FIG. 6(a). The chuck table 36 is then moved in a direction indicated by an arrow X2 at a predetermined processing-feed rate. When in the course of movement of the chuck table 36 in the direction indicated by the arrow X2, the X-direction coordinate values of each metal pattern 214 detected by the above street detection step reaches the position right below the condenser 524, the control means 100 outputs a control signal to the laser beam application means 52 to apply a laser beam to the metal pattern 214 from the condenser 524 so as to remove the metal pattern 214. And, as shown in FIG. 6 (b), only the plurality of metal patterns formed on the street 211 are removed before one end (left end in the figure) of the predetermined street 211 reaches right below the condenser 524 of the laser beam application means 52 (metal pattern removing step).

The following processing conditions are set for the above metal pattern removing step in the illustrated embodiment. The thickness of each metal pattern 214 is set to 5 μm.

Processing conditions: metal pattern removing step
Light source: YAG laser or YVO4 laser
Wavelength: 355 nm (ultraviolet radiation)
Output: 1.0 W
Repetition frequency: 50 kHz
Pulse width: 10 ns
Focusing spot diameter: 25 μm
Feed rate: 50 mm/sec.

Figure 7:
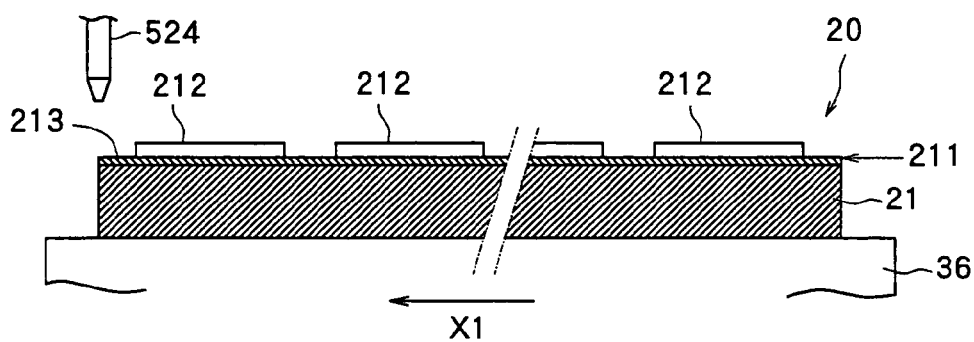
FIGS. 7(a) and 7(b) are diagrams for explaining the low-dielectric insulating film removing step in the laser beam processing method of the present invention.
Figure 7:
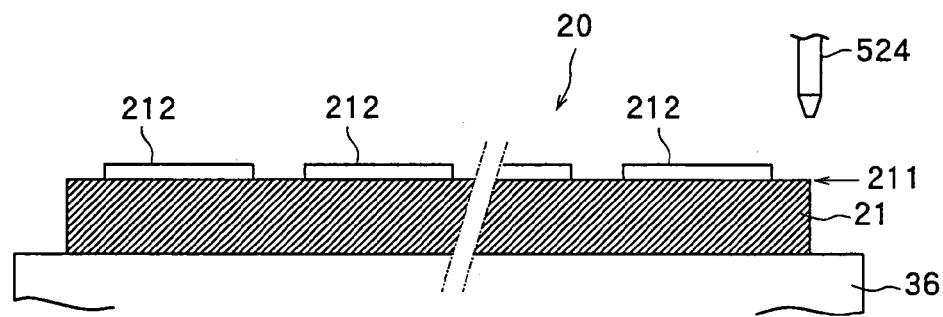

After the metal patterns 214 formed on the street 211 are removed by carrying out the metal pattern removing step as described above, one end (left end in the figure) of the predetermined street 211 from which the metal patterns 214 have been removed is brought into a position right below the condenser 524 of the laser beam application means 52 as shown in FIG. 7(a). Then, the control means 100 outputs a control signal to the laser beam application means 52 to apply a laser beam to the low-dielectric insulating film 213 from the condenser 524 while the chuck table 36 is moved in the direction indicated by the arrow X1 at a predetermined feed rate. As a result, as shown in FIG. 7(b), the low-dielectric insulating film 213 formed on the street 211 is removed before the condenser 524 reaches the other end (right end in the figure) of the predetermined street 211 (low-dielectric insulating film removing step).

The following processing conditions are set for the above low-dielectric insulating film removing step in the above illustrated embodiment. The thickness of the low-dielectric insulating film 213 is set to 10 μm.

Processing conditions: low-dielectric insulating film removing step
Light source: YAG laser or YVO4 laser
Wavelength: 355 nm (ultraviolet radiation)
Output: 0.5 W
Repetition frequency: 50 kHz
Pulse width: 10 ns
Focusing spot diameter: 25 μm
Feed rate: 100 mm/sec.

After the street detection step, metal pattern removing step and low-dielectric insulating film removing step are carried out along the predetermined street 211, the chuck table 36, i.e., the semiconductor wafer 20 held on the chuck table 36 is moved by the interval between adjacent streets 211 in the direction indicated by the arrow Y (indexing step) to carry out the above street detection step, metal pattern removing step and low-dielectric insulating film removing step similarly. After the street detection step, metal pattern removing step and low-dielectric insulating film removing step are carried out for all the streets 211 extending in the predetermined direction, the chuck table 36, i.e., the semiconductor wafer 20 held on the chuck table 36 is turned at 90° to carry out the above street detection step, metal pattern removing step and low-dielectric insulating film removing step for streets 211 extending in a direction perpendicular to the above predetermined direction, whereby the metal patterns 214 and the low-dielectric insulating film 213 formed on all the streets 211 of the semiconductor wafer 20 are removed.

In the above embodiment, as the processing conditions for the metal pattern removing step and the low-dielectric insulating film removing step, the output of the laser beam and the processing-feed rate are changed. However, only one of them may be changed.

In the above embodiment, the street detection step, metal pattern removing step and low-dielectric insulating film removing step are carried out respectively for every each street. However, the street detection step may be carried out for all the streets, and the detected information on all the streets may be stored in the random access memory (RAM) 103 prior to the metal pattern removing step and the low-dielectric insulating film removing step.

After the metal patterns 214 and the low-dielectric insulating film 213 formed on all the streets 211 of the semiconductor wafer 20 are removed as described above, the chuck table 36 holding the semiconductor wafer 20 is returned to the position where it first suction-held the semiconductor wafer 20, to cancel its suction-holding of the semiconductor wafer 20. The semiconductor wafer 20 is then carried to the dicing step by a conveying means that is not shown. In this dicing step, the semiconductor wafer 20 is cut along the streets 211 by a cutting machine having a cutting blade to be divided into individual semiconductor chips. Since the metal patterns 214 and the low-dielectric insulating film 213 formed on the streets 211 have been already removed at this point, the occurrence of peeling at the time when the low-dielectric insulating film is cut with the blade, can be prevented beforehand.

Another embodiment of the present invention will be described below.

In the above embodiment, the coordinate values in the X direction, at which the metal patterns 214 are formed on each street 211 of the semiconductor wafer 20, are detected in the street detection step prior to the metal pattern removing step and the low-dielectric insulating film removing step. The metal pattern removing step and the low-dielectric insulating film removing step, however, can be carried out without the street detecting step. That is, information on the design positions and sizes of the streets 211 formed on the semiconductor wafer 20 and the metal patterns 214 formed on each street 211 is in advance stored in the read-only memory (ROM) 102 or optionally the random access memory (RAM) 103 of the control means 100. By carrying out the above metal pattern removing step and the low-dielectric insulating film removing step based on the information stored in the read-only memory (ROM) 102 or the random access memory (RAM) 103, the metal patterns 214 and the low-dielectric insulating film 213 formed on all the streets 211 of the semiconductor wafer 20 can be removed without the street detecting step.

In the above embodiments, the metal pattern removing step and the low-dielectric insulating film removing step are carried out completely separately. However, when a laser beam is applied by alternately changing the processing conditions between the area where only the low-dielectric insulating film 213 is formed and the area where both the low-dielectric insulating film 213 and the metal pattern 214 are formed at the time when each street 211 is processed, the metal pattern removing step and the low-dielectric insulating film removing step can be carried out by one time processing-feed.

According to the present invention, since a laser beam is applied to the low-dielectric insulating film and the metal patterns for testing formed on the streets of the semiconductor wafer under different processing conditions as described above, the low-dielectric insulating film and the metal patterns can be removed smoothly without damaging the semiconductor substrate and the circuits.

We claim:

1. A laser beam processing method for a semiconductor wafer having a semiconductor substrate, a low-dielectric insulating film formed on the front surface of the semiconductor substrate, a plurality of circuits sectioned by streets into a lattice pattern, and metal patterns for testing formed partially in areas on each street, said method comprising:
   a street detecting step for detecting the position of each said areas by taking an image of each street; and
   a laser beam processing step for applying a laser beam to the positions of detected areas at which the metal patterns are located, under first processing conditions, and to the low-dielectric insulating film under second processing conditions different from the first processing conditions to remove the metal patterns and the low-dielectric insulating film, the processing conditions including the output of the laser beam and the processing-feed rate of the semiconductor wafer.

2. The laser beam processing method according to claim 1, wherein the laser beam processing step comprises a metal pattern removing step for applying the laser beam to the metal patterns under the first processing conditions to remove the metal patterns, and a low-dielectric insulating film removing step for applying the laser beam to the low-dielectric insulating film under the second processing conditions to remove the low-dielectric insulating film.

* * * * *